United States Patent
Li et al.

(10) Patent No.: US 12,100,456 B2
(45) Date of Patent: *Sep. 24, 2024

(54) MEMORY DEVICE AND ERASING AND VERIFICATION METHOD THEREOF

(71) Applicant: YANGTZE MEMORY TECHNOLOGIES CO., LTD., Wuhan (CN)

(72) Inventors: Kaiwei Li, Wuhan (CN); Jianquan Jia, Wuhan (CN); Hongtao Liu, Wuhan (CN); An Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/141,207

(22) Filed: Apr. 28, 2023

(65) Prior Publication Data

US 2023/0268007 A1  Aug. 24, 2023

Related U.S. Application Data

(63) Continuation of application No. 17/485,241, filed on Sep. 24, 2021, now Pat. No. 11,676,665, which is a continuation of application No. 16/905,880, filed on Jun. 18, 2020, now Pat. No. 11,158,380, which is a continuation of application No. PCT/CN2020/087356, filed on Apr. 28, 2020.

(51) Int. Cl.
*G11C 16/14* (2006.01)
*G11C 16/34* (2006.01)
*G11C 16/04* (2006.01)

(52) U.S. Cl.
CPC .......... *G11C 16/14* (2013.01); *G11C 16/3445* (2013.01); *G11C 16/0483* (2013.01)

(58) Field of Classification Search
CPC .. G11C 16/14; G11C 16/3445; G11C 16/0483
USPC ........................................ 365/185.11, 185.24
See application file for complete search history.

(56) References Cited

U.S. PATENT DOCUMENTS

| | | |
|---|---|---|
| 5,515,324 A | 5/1996 | Tanaka |
| 6,055,188 A | 4/2000 | Takeuchi et al. |
| 6,108,238 A | 8/2000 | Nakamura et al. |
| 6,108,263 A | 8/2000 | Bauser et al. |
| 7,995,392 B2 | 8/2011 | Shibata |

(Continued)

FOREIGN PATENT DOCUMENTS

| | | |
|---|---|---|
| CN | 102881329 A | 1/2013 |
| CN | 105513639 A | 4/2016 |

(Continued)

*Primary Examiner* — Michael T Tran
(74) *Attorney, Agent, or Firm* — BAYES PLLC

(57) ABSTRACT

A memory device includes a memory string and a control circuit coupled to the memory string. The memory string includes a top select gate, word lines, and a bottom select gate. The control circuit is configured to, in an erasing operation, apply an erasing voltage to the memory string, apply a verifying voltage to at least one word line of the word lines after applying the erasing voltage to the memory string, and apply a first turn-on voltage to the bottom select gate, before applying the verifying voltage to the at least one word line.

20 Claims, 6 Drawing Sheets

(56) References Cited

U.S. PATENT DOCUMENTS

| | | | |
|---|---|---|---|
| 8,081,513 B2 | 12/2011 | Fukuda | |
| 9,343,160 B1* | 5/2016 | Dutta | G11C 16/345 |
| 9,449,698 B1 | 9/2016 | Paudel et al. | |
| 9,460,799 B1 | 10/2016 | Costa | |
| 10,020,046 B1 | 7/2018 | Uemura | |
| 10,276,250 B1* | 4/2019 | Chen | G11C 16/3427 |
| 10,381,083 B1* | 8/2019 | Yang | G11C 16/30 |
| 10,685,723 B1 | 6/2020 | Chen et al. | |
| 10,832,778 B1* | 11/2020 | Yang | G11C 16/24 |
| 11,133,074 B1* | 9/2021 | Li | G11C 16/3472 |
| 11,335,411 B1* | 5/2022 | Lien | G11C 16/14 |
| 11,335,419 B1* | 5/2022 | Li | G11C 29/028 |
| 2004/0208061 A1 | 10/2004 | Toda | |
| 2006/0233012 A1 | 10/2006 | Sekiguchi et al. | |
| 2008/0013360 A1 | 1/2008 | Hemink | |
| 2008/0019164 A1 | 1/2008 | Hemink et al. | |
| 2008/0037307 A1* | 2/2008 | Goda | G11C 16/344 365/7 |
| 2008/0158983 A1 | 7/2008 | Mokhlesi et al. | |
| 2009/0113259 A1* | 4/2009 | Aritome | G11C 16/3445 714/721 |
| 2009/0154252 A1 | 6/2009 | Shibata | |
| 2009/0207657 A1 | 8/2009 | Tamada | |
| 2009/0231919 A1 | 9/2009 | Won | |
| 2009/0273978 A1 | 11/2009 | Fukuda | |
| 2009/0303799 A1 | 12/2009 | Nakamura | |
| 2009/0323432 A1 | 12/2009 | Futatsuyama et al. | |
| 2010/0002514 A1 | 1/2010 | Lutze et al. | |
| 2010/0067299 A1 | 3/2010 | Futatsuyama | |
| 2010/0214842 A1 | 8/2010 | Honda | |
| 2011/0176362 A1* | 7/2011 | Shibata | G11C 16/32 365/185.33 |
| 2012/0127803 A1 | 5/2012 | Hazama | |
| 2012/0195123 A1 | 8/2012 | Lee | |
| 2012/0224427 A1 | 9/2012 | Takekida | |
| 2013/0088920 A1 | 4/2013 | Huang et al. | |
| 2013/0272067 A1 | 10/2013 | Lee et al. | |
| 2014/0226414 A1 | 8/2014 | Costa et al. | |
| 2014/0347928 A1 | 11/2014 | Lee | |
| 2015/0003157 A1 | 1/2015 | Aritome | |
| 2016/0027504 A1 | 1/2016 | Lee | |
| 2016/0217860 A1 | 7/2016 | Lai et al. | |
| 2016/0240264 A1 | 8/2016 | Hosono | |
| 2017/0018555 A1 | 1/2017 | Kwan et al. | |
| 2017/0076801 A1 | 3/2017 | Shirakawa et al. | |
| 2018/0137005 A1 | 5/2018 | Wu et al. | |
| 2018/0151237 A1 | 5/2018 | Lee et al. | |
| 2019/0051355 A1* | 2/2019 | Lee | G11C 16/3459 |
| 2019/0279720 A1 | 9/2019 | Nam et al. | |
| 2019/0371416 A1 | 12/2019 | Kuddannavar et al. | |
| 2020/0013468 A1 | 1/2020 | Yoshida et al. | |
| 2020/0075102 A1 | 3/2020 | Liu et al. | |
| 2020/0075110 A1 | 3/2020 | Suzuki et al. | |
| 2020/0194077 A1 | 6/2020 | Sanad et al. | |
| 2020/0211663 A1 | 7/2020 | Baraskar et al. | |
| 2020/0381057 A1* | 12/2020 | Park | G06F 3/0604 |
| 2020/0381067 A1 | 12/2020 | Maeda | |
| 2020/0388342 A1 | 12/2020 | Yang et al. | |
| 2021/0175240 A1 | 6/2021 | Tran et al. | |
| 2021/0175243 A1 | 6/2021 | Shin et al. | |
| 2021/0183447 A1 | 6/2021 | Chai | |
| 2021/0183851 A1 | 6/2021 | Davis et al. | |
| 2021/0193194 A1 | 6/2021 | Suzuki et al. | |
| 2021/0193227 A1 | 6/2021 | Kim | |
| 2021/0264981 A1 | 8/2021 | Liu et al. | |
| 2023/0162805 A1* | 5/2023 | Wu | G11C 16/08 365/185.17 |

FOREIGN PATENT DOCUMENTS

| | | |
|---|---|---|
| CN | 109273039 A | 1/2019 |
| CN | 111373478 A | 7/2020 |
| JP | 2002313089 A | 10/2002 |
| JP | 2009266356 A | 11/2009 |
| JP | 2010067327 A | 3/2010 |
| JP | 2017168163 A | 9/2017 |
| JP | 2018045749 A | 3/2018 |
| JP | 2022524578 A | 5/2022 |
| WO | 2018/132186 A1 | 7/2018 |
| WO | 2021168674 A1 | 9/2021 |

* cited by examiner

MEMORY DEVICE AND ERASING AND VERIFICATION METHOD THEREOF

CROSS REFERENCE TO RELATED APPLICATIONS

This application is a continuation of U.S. application Ser. No. 17/485,241, filed on Sep. 24, 2021, which is a continuation of U.S. application Ser. No. 16/905,880, filed on Jun. 18, 2020, which is a continuation of International Application No. PCT/CN2020/087356, filed on Apr. 28, 2020, all of which are incorporated herein by reference in their entireties.

BACKGROUND

The present disclosure relates to a memory device and erasing and verification method thereof, and more particularly, to a memory device and erasing and verification method thereof capable of increasing channel discharging time to avoid false error verification.

Semiconductor memories are widely used in various electronic devices such as cellular phones, digital cameras, personal digital assistants, medical electronic devices, mobile computing devices and non-mobile computing devices. A nonvolatile memory allows information to be stored and retained. Examples of the nonvolatile memory comprises a flash memory (e.g., NAND type and NOR type flash memory) and electrically erasable programmable read only memory (Electrically Erasable Programmable Read-Only Memory, EEPROM).

Recently, ultra high density storage devices have been proposed using a three-dimensional (3D) stacked memory structure sometimes referred to as a Bit Cost Scalable (BiCS) architecture. For example, a 3D NAND stacked flash memory device can be formed from an array of alternating conductive and dielectric layers. A memory hole is drilled in the layers to define many memory layers simultaneously. A NAND string is then formed by filling the memory hole with appropriate materials. Control gates of the memory cells are provided by the conductive layers.

Each planar NAND memory consists of an array of memory cells connected by multiple word lines and bit lines. Data is programmed into or read from the planar NAND memory on a page-by-page basis, and erased from the planar NAND memory on a block-by-block basis, i.e., a block is the unit of a conventional erasing operation and a page is the unit of a conventional programming operation.

For the existing three-dimensional (3D) NAND Flash structure, after an erasing stage, a verification stage is required to verify whether the erasing is successful or not. However, in the 3D NAND Flash, a false error may occur in the verification stage.

SUMMARY

It is therefore an objective of the present disclosure to provide a memory device and erasing and verification method thereof capable of increasing channel discharging time to avoid false error verification.

The present disclosure discloses a memory device. The memory device includes a plurality of memory blocks, and a control circuit. A selected memory block of the plurality of memory blocks comprises a top select gate, a bottom select gate, a plurality of word lines, a common-source line, and a P-well. The control circuit performs an erasing and verification method, wherein the erasing and verification method includes erasing the selected memory block during an erasing stage; and maintaining the bottom select gate to be turned on during a maintaining period before the top select gate are turned on during a verification stage.

The present disclosure discloses an erasing and verification method for a memory device, wherein a selected memory block of the plurality of memory blocks of the memory device comprises a top select gate, a bottom select gate, a plurality of word lines, a common-source line, and a P-well. The erasing and verification method includes erasing the selected memory block during an erasing stage; and maintaining the bottom select gate to be turned on during a maintaining period before the top select gate is turned on during a verification stage.

These and other objectives of the present disclosure will no doubt become obvious to those of ordinary skill in the art after reading the following detailed description of the embodiments that are illustrated in the various figures and drawings.

DETAILED DESCRIPTION

Figures 1, 2:
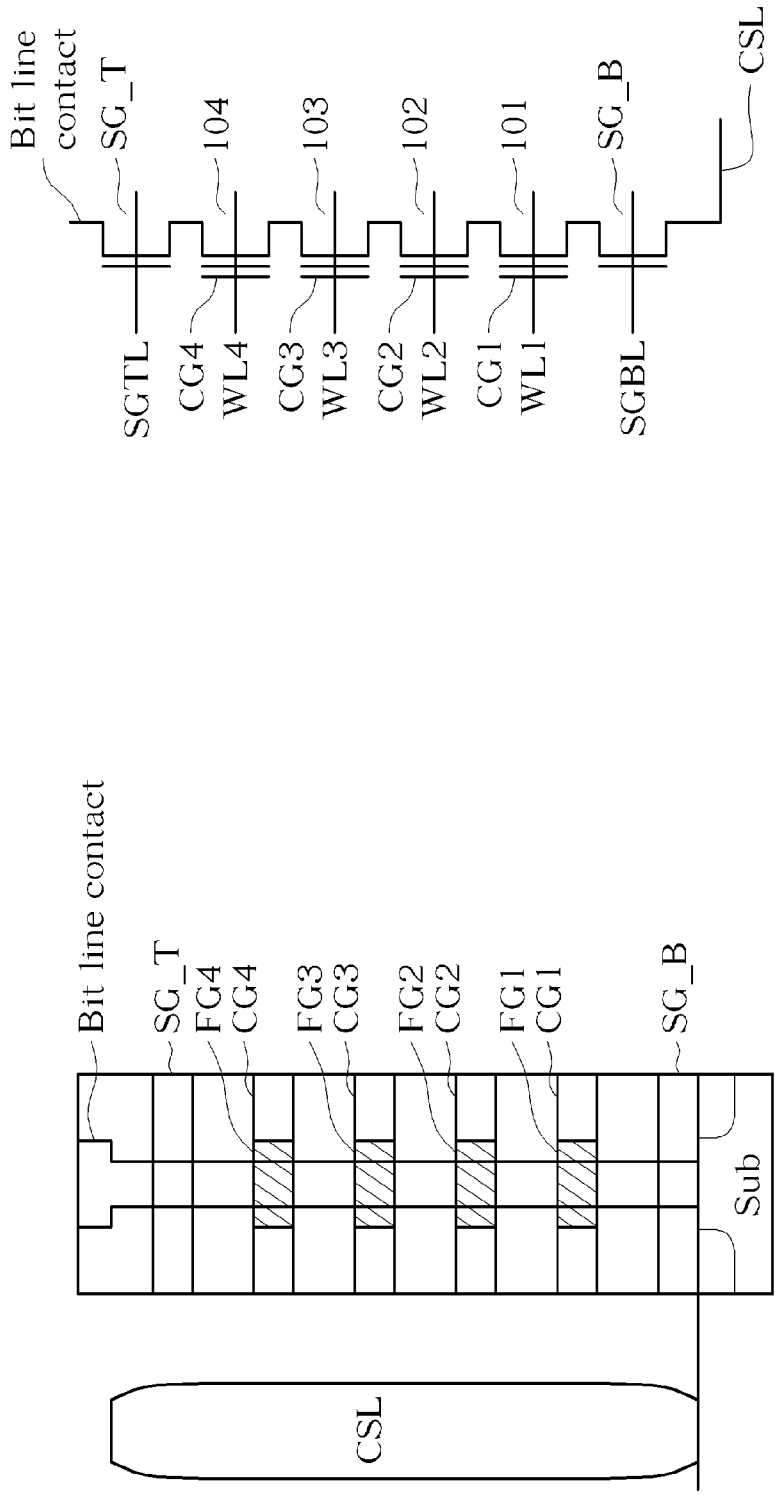
FIG. 1 is a top-view diagram illustrating one NAND string according to an embodiment of the present disclosure.
FIG. 2 is a diagram illustrating an equivalent circuit of one NAND string according to an embodiment of the present disclosure.

In the following detailed description, reference is made to the accompanying drawings that show, by way of illustration, specific embodiments in which the present disclosure may be practiced. These embodiments are described in sufficient detail to enable those skilled in the art to practice the present disclosure. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the location or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

In the following description and in the claims, the terms "include" and "comprise" are used in an open-ended fashion, and thus should be interpreted to mean "include, but not limited to." Also, the term "couple" is intended to mean either an indirect or direct electrical connection. Accordingly, if one device is electrically connected to another device, that connection may be through a direct electrical connection, or through an indirect electrical connection via other devices and connections. "Roughly" means that within the acceptable error budgets, those skilled in the art can solve the technical problem within a certain error budgets, and basically achieve the technical effect.

FIG. 1 is a top-view diagram illustrating a NAND string according to an embodiment of the present disclosure. FIG. 2 is a diagram illustrating an equivalent circuit thereof. In a flash memory system using the NAND structure, multiple transistors are arranged in series and sandwiched between two select gates, which are referred to as a NAND string. The NAND string depicted in FIGS. 1 and 2 includes four transistors 101-104 coupled in series and sandwiched between a top select gate SG_T, a bottom select gate SG_B (on the source side) and a substrate Sub, wherein the substrate Sub comprises a P-well. The top select gate SG_T is arranged for connecting the NAND string to a bit line via a bit line contact and may be controlled by applying appropriate voltages to a select gate line SGTL. The bottom select gate SG_B is arranged for connecting the NAND string to a common-source line CSL and may be controlled by applying appropriate voltages to a select gate line SGBL. The common-source line CSL passes through the stacked structure. Each of the transistors 101-104 includes a control gate and a floating gate. For example, the transistor 101 includes a control gate CG1 and a floating gate FG1, the transistor 102 includes a control gate CG2 and a floating gate FG2, the transistor 103 includes a control gate CG3 and a floating gate FG3, and the transistor 104 includes a control gate CG4 and a floating gate FG4. The control gate CG1 is connected to a word line WL1, the control gate CG2 is connected to a word line WL2, the control gate CG3 is connected to a word line WL3, and the control gate CG4 is connected to a word line WL4.

For illustrative purpose, FIGS. 1 and 2 show four memory cells in the NAND string. In other embodiments, a NAND string may include 8 memory cells, 16 memory cells, 32 memory cells, 64 memory cells, 128 memory cells, etc. However, the number of memory cells in a NAND string does not limit the scope of the present disclosure.

A typical architecture for a flash memory system using a NAND structure includes several NAND strings. Each NAND string is connected to the common source line CSL by its bottom select gate SG_B controlled by the select line SGBL and connected to its associated bit line by its top select gate SG_T controlled by the select line SGTL. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 3:
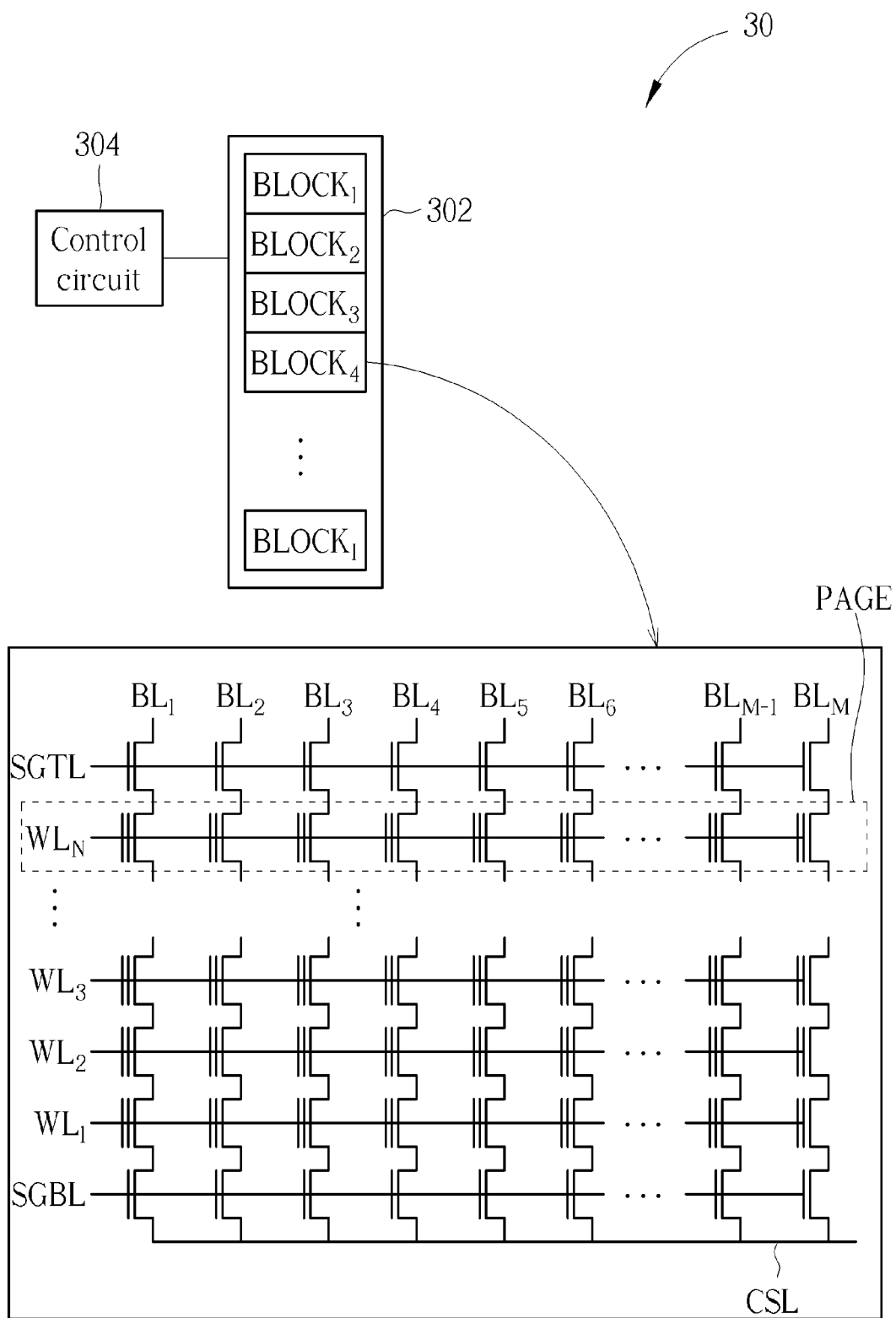
FIG. 3 is a diagram illustrating an exemplary structure of a memory device according to an embodiment of the present disclosure.

FIG. 3 is a diagram illustrating an exemplary structure of a memory device 30 according to an embodiment of the present disclosure. The memory device 30 includes a memory array 302 and a control circuit 304. The control circuit 304 is utilized for performing reading, writing, erasing and verification operations on the memory array 302, and may include word line drivers, bit line drivers, column decoders, sensing circuits, a data buffer, a program verify logic and a erasing verify circuit. The memory array 302 is divided into multiple memory blocks of memory cells denoted by $BLOCK_1 \sim BLOCK_I$, wherein I is a positive integer and typically equal to a large number. A block contains a set of NAND strings which are accessed via bit lines $BL_1$-$BL_M$ and a common set of word lines $WL_1 \sim WL_N$, wherein M and N are integers larger than 1. One terminal of the NAND string is connected to a corresponding bit line via the top select gate (connected to the select gate line SGTL), and another terminal is connected to the common source line CSL via the bottom select gate (connected to select gate line SGBL). Each block is typically divided into a number of pages as indicated by the dotted lines. In one embodiment, a block is the unit of a conventional erasing operation, and a page is the unit of a conventional programming operation. However, other units of erase/program can also be used.

When the control circuit 304 performs erasing operation in a unit of a block, a corresponding verification operation must be taken to guarantee that corresponding memory cells are erased to prevent data remanence or meta-stability, which would cause short life to the 3D NAND flash memory.

More specifically, in the verification stage, the corresponding memory cells are conducted, to examine whether the corresponding memory cells are "strong" logic 1 or "weak" logic 1 by measuring threshold voltages of the corresponding memory cells. If the corresponding memory cells are not "strong" enough, or the threshold voltages of the corresponding memory cells does not meet a predefined threshold, the bit-cell may turn to logic 0 from logic 1 during aging, and the reliability of 3D NAND flash is degraded. Therefore, after the erasing stage, it needs to check the bit-cell to determine whether the threshold voltages of the corresponding memory cells meet the predefined threshold or not. However, a false error may occur in the verification stage.

Figure 4:
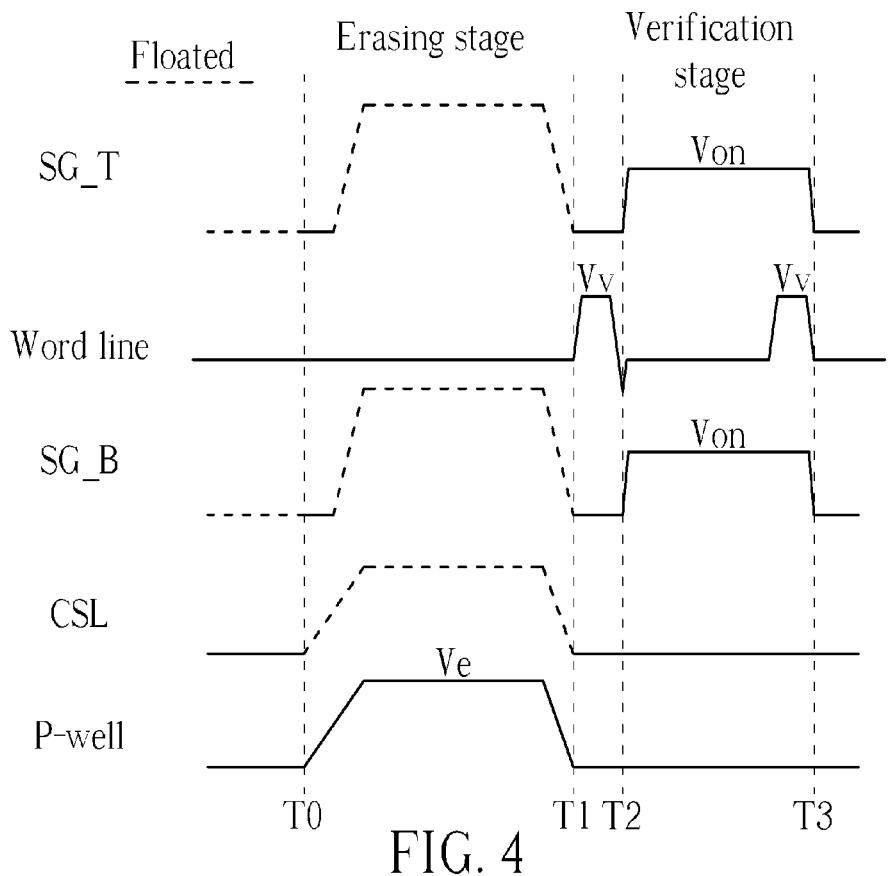
FIG. 4 is a timing chart of a conventional erasing and verification process.

In detail, please refer to FIG. 4, which is a timing chart of a conventional erasing and verification process, wherein T1 is when a verification stage begins, T2 is when a voltage of a top select gate SG_T starts to reach a turn-on voltage Von, and T3 is when the verification stage ends. As shown in FIG. 4, when a selected memory block of the memory blocks $BLOCK_1 \sim BLOCK_I$ is selected to be erased, by taking one NAND string as an example, a top select gate SG_T, a bottom select gate SG_B and a common source line CSL are floated, word lines are grounded and the P-well is provided with an erasing voltage Ve (i.e. a voltage of the P-well rises to and maintains as the erasing voltage Ve for a period of time, and then drops to zero) in the erasing stage. Therefore, electrons trapped in floating gates of corresponding memory cells are attracted by the high erasing voltage Ve of the P-well and leave the floating gates, such that the corresponding memory cells are erased.

Then, in the verification stage, word lines are provided with a verification voltage Vv (e.g., 2.2 V), then the top select gate SG_T, the bottom select gate SG_B are provided with a turn-on voltage Von, and the word lines are provided with the verification voltage Vv again in the end, to check whether the threshold voltages of the corresponding memory cells meet the predefined threshold or not. If the threshold voltages of the corresponding memory cells do not meet the predefined threshold, i.e., a verification during the verification stage is failed, another erasing stage and another verification stage are performed until the threshold voltages of the corresponding memory cells meet the predefined threshold, or an error message is generated if a predefined number of verification stages with failed verification are performed.

Figure 5A:
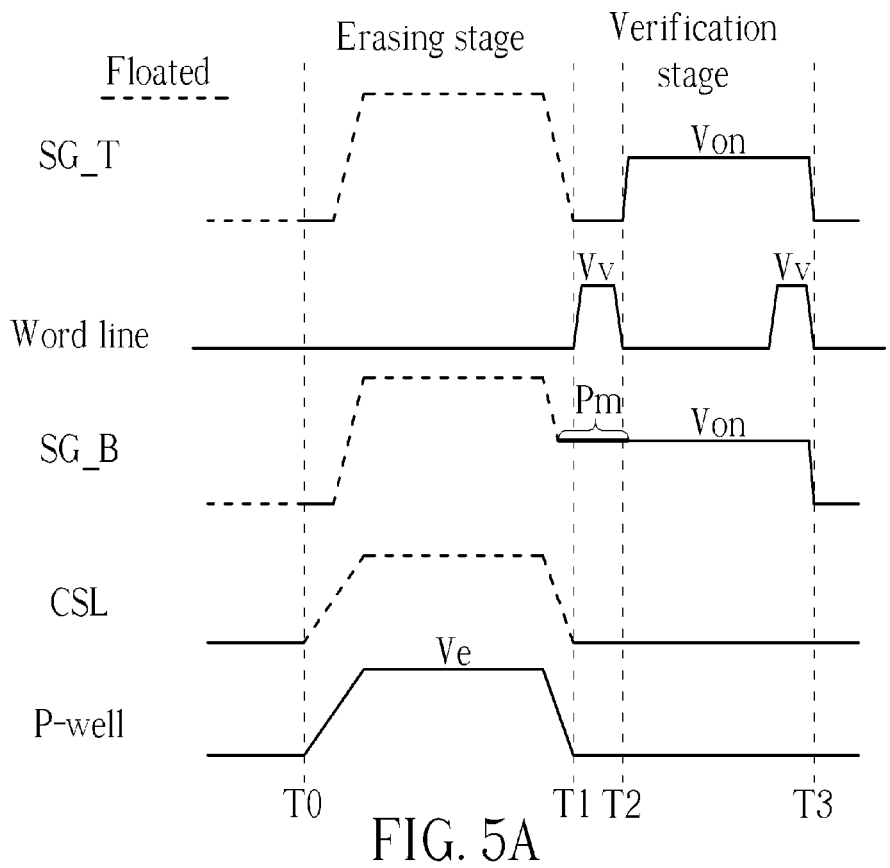
FIG. 5A is a timing chart of an erasing and verification process according to an embodiment of the present disclosure.
Figure 5B:
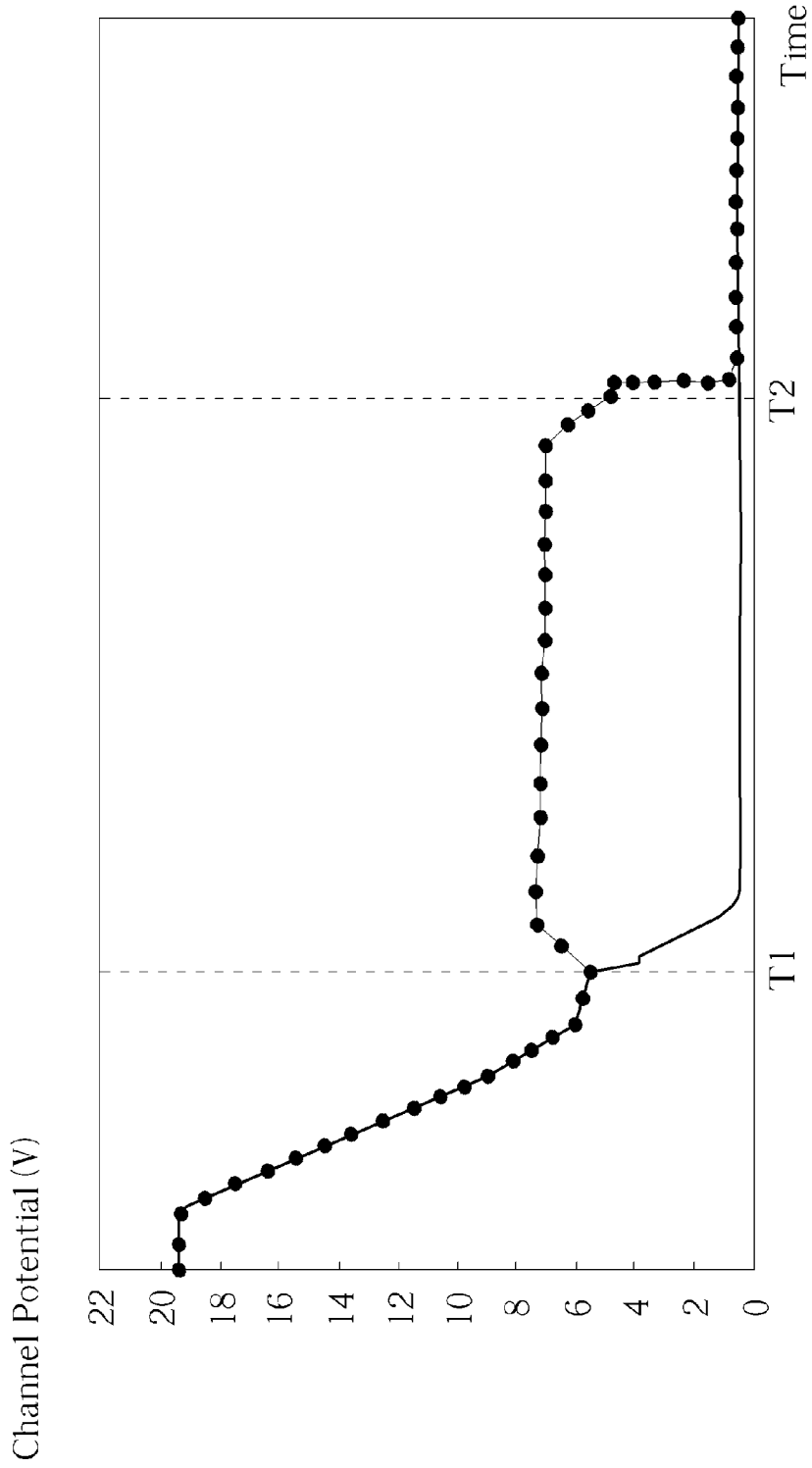
FIG. 5B is a schematic diagram of channel potentials of the conventional erasing and verification process and the erasing and verification process according to an embodiment of the present disclosure.

However, since the top select gate SG5_T and the bottom select gate SG_B are floated in the erasing stage, when the voltage of the P-well decreases to zero, voltages of the top select gate SG_T and the bottom select gate SG_B drop accordingly and then belong the turn-on voltage Von, such that the bottom select gate SG_B is turned off and thus a channel stops discharging and is floated (as shown in the dotted line of FIG. 5B). Then, when the voltages of the word lines rise to the verification voltage Vv during the verification stage (between T1 and T2), a potential of the channel is coupled with the voltages of the word lines to stay at a higher potential. Afterwards, when the top select gate SG_T and the bottom select gate SG_B are turned on in the verification stage (after T2), the channel is connected with the P-well and thus grounded, such that the potential of the channel drops rapidly and thus the voltages of the word lines are coupled to drop accordingly. As a result, a false error occurs in the first verification stage, which requires another erasing stage and another verification stage, and thus the corresponding memory cells are over-erased with threshold voltages lower than required.

For example, if the corresponding memory cells are erased to strong logic 1, but determined to be weak logic 1, then another erasing stage is needed to guarantee that erasing is successful. However, it is a redundant step to erase the corresponding memory cells with strong logic 1 since the corresponding memory cells are logically strong enough. As a result, the more of the false error results in the longer period of the erasing stage and verification stage, which degrades the reliability and programming performance of the memory device 30.

In comparison, in the erasing and verification process of the present disclosure, when a selected memory block of the memory blocks $BLOCK_1 \sim BLOCK_j$ is selected to be erased, the control circuit 304 maintains the bottom select gate SG_B to be turned on during a maintaining period before the top select gate SG_T is turned on during a verification stage. As a result, by maintaining the bottom select gate SG_B to be turned on during the maintaining period before the top select gate SG_T is turned on during a verification stage, the present disclosure increases channel discharging time to avoid voltage drop of the word lines and false error verification thereafter.

More specifically, please refer to FIGS. 5A and 5B, FIG. 5A is a timing chart of an erasing and verification process according to an embodiment of the present disclosure, and FIG. 5B is a schematic diagram of channel potentials of the conventional erasing and verification process and the erasing and verification process according to an embodiment of the present disclosure. As can be seen from FIG. 5A, when a selected memory block of the memory blocks $BLOCK_1 \sim BLOCK_j$ is selected to be erased, by taking one NAND string as an example, the bottom select gate SG_B is switched from floated to be maintained at the turn-on voltage Von (e.g. 6.5V) during a maintaining period Pm before the top select gate SG_T is turned, wherein the maintaining period Pm is from a voltage of the bottom select gate SG_B drops to the turn-on voltage Von as a voltage of the P-well decreases till the top select gate SG_T is turned on during the verification stage.

Under such a situation, the common-source line CSL and the channel can be connected during the maintaining period Pm. Therefore, in comparison with the conventional erasing and verification process with issues of higher channel potential due to word line coupling and voltage drop of the word lines due to channel discharging coupling in the above description, the channel keeps discharged to zero potential in the early verification stage (after T1) as shown in the solid line in FIG. 5B in the present disclosure, thereby increasing channel discharging time and avoiding voltage drop of the word lines as shown in FIG. 5A. Other operations of the erasing and verification process can be derived by referring to the above description of the conventional erasing and verification process, e.g., the bottom select gate is floated during the erasing stage except the maintaining period Pm, and are not narrated hereinafter for brevity. As a result, the present disclosure increases channel discharging time to avoid false error verification thereafter, to improve efficiency of erasing and verification process.

Noticeably, the spirit of the present disclosure is to maintain the bottom select gate SG_B to be turned on during a maintaining period before the top select gate SG_T is turned on during the verification stage, to increases channel discharging time to avoid voltage drop of the word lines due to channel discharging coupling. Those skilled in the art could make modifications or alterations, which still belong to the scope of the present disclosure. For example, a maintaining period during which the bottom select gate SG_B is turned on is not limited to the maintaining period Pm shown in FIG. 5A, and can be other time intervals, as long as the maintaining period is before the top select gate SG_T is turned on during the verification stage.

Figure 6A:
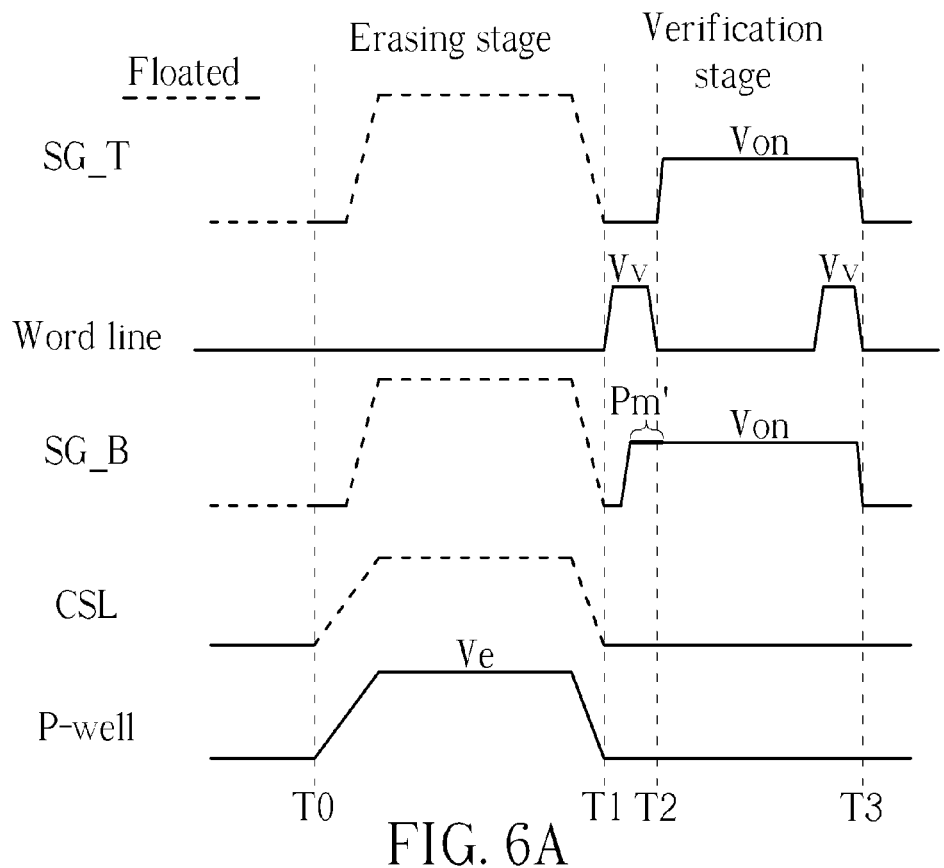
FIGS. 6A and 6B are timing charts of erasing and verification processes according to other embodiments of the present disclosure.
Figure 6B:
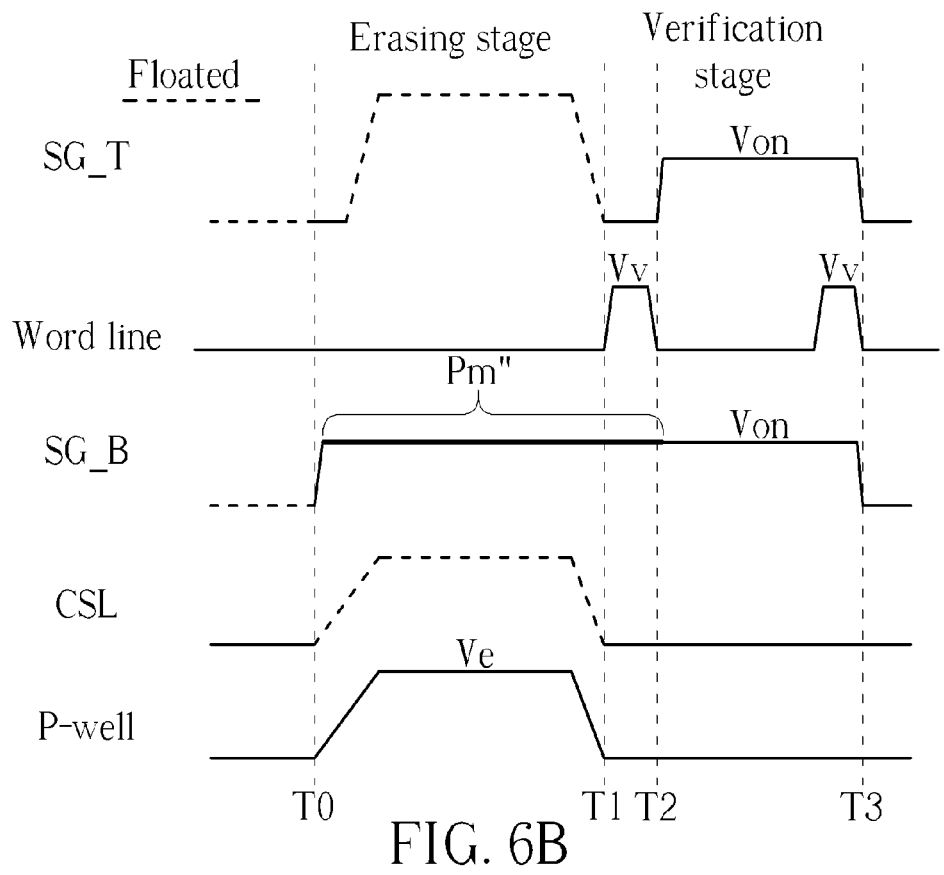

For example, please refer to FIGS. 6A and 6B, which are timing charts of erasing and verification processes according to other embodiments of the present disclosure. As shown in FIG. 6A, a maintaining period Pm' is within the verification stage, i.e., from around a midpoint between T1 and T2 till the top select gate SG_T is turned on. Under such a situation, although a channel potential may become higher due to word line coupling as shown in the dotted line of FIG. 5B as the conventional erasing and verification process, the channel can still be discharged to reach zero potential rapidly even if starting from the midpoint between T1 and T2 (by referring to the solid line of FIG. 5B, the channel can be discharged rapidly). As a result, even if the maintaining period Pm' is shorter than the maintaining period Pm, the embodiment of FIG. 6A can also increase channel discharging time to avoid voltage drop of the word lines due to channel discharging coupling.

On the other hand, as shown in FIG. 6B, a maintaining period Pm" is from a beginning of the erasing stage till the top select gate SG_T is turned on. Under such a situation, the channel is conducted so as to make the electron to be released as fast as possible.

Notably, the default value of the 3D NAND flash is logic 1 in the above embodiments. However, in other embodiments, the default value of the 3D NAND flash may be logic 0, and the moving of erasing is to make the memory cell from 1 to 0. In an embodiment, the high voltage (say 1.1 Volt) represents the logic 1, and in an embodiment, the logic 1 may be represented by low voltage (say 0 Volt), which is not limited thereto. Moreover, the predefined threshold between strong logic 1 and logic 0 may differ between the techniques of process; for example, the thresholds may be 0.7 volt in 22 nm ultra-low power (22ULP) technology. Those skilled in the art may make modifications and alterations accordingly, which is not limited herein.

Besides, although the present disclosure avoids false error verification, however, if the threshold voltages of the corresponding memory cells does not meet the predefined threshold, i.e. a verification during the verification stage is failed, another erasing stage and another verification stage are performed until the threshold voltages of the corresponding memory cells meet the predefined threshold, or an error message is generated if a predefined number of verification stages with failed verification are performed. The criteria to determine the failure of the erasing and verification process is not limited, and may be based on a threshold time, a threshold number of performing erasing and verification process for the 3D NAND flash, or any combination thereof. In addition, the threshold time or the threshold number may be fixed by pre-determining or calibration, be a number mapped by a table, or adjusted accordingly to fit the practical scenario. Those skilled in the art may make modifications of the decision rule and alterations accordingly, and not limited herein.

In addition, the erasing and verification process may be modified to have a verification stage to follow a plurality of erasing stages in sequence. For example, the 3D NAND flash erasing and verification process may comprise a first erasing stage, a second erasing stage, and a verification stage. In an embodiment, each of the erasing and verification process should include a maintaining period during which the bottom select gate SG_B is turned on, to increase channel discharging time and thus avoid voltage drop of the word lines due to channel discharging coupling.

Notably, the embodiments stated in the above are utilized for illustrating the concept of the present disclosure. Those skilled in the art may make modifications and alterations accordingly, and not limited herein. Hence, as long as the bottom select gate SG_B is turned on before the top select gate SG_T is turned on during the verification stage, the requirement of the present application is satisfied, which is within the scope of the present application.

Figure 7:
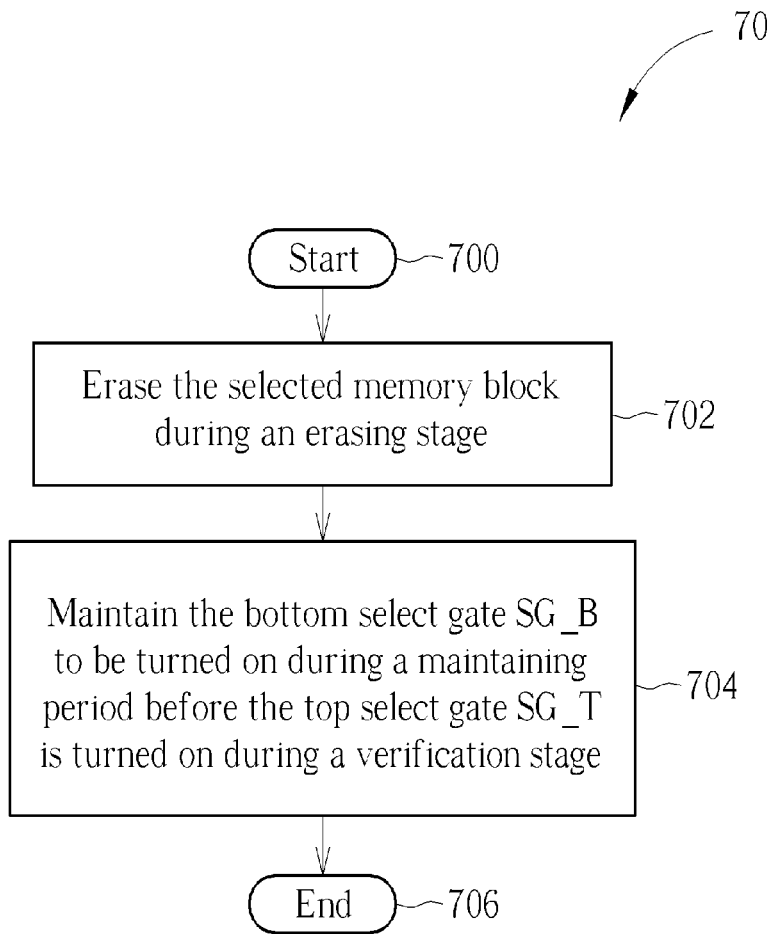
FIG. 7 is a schematic diagram of an erasing and verification process according to an embodiment of the present disclosure.

FIG. 7 is a schematic diagram of an erasing and verification process 70 according to an embodiment of the present disclosure. As shown in FIG. 7, the 3D NAND flash erasing and verification process 70 comprises the following steps:

Step 700: Start.
Step 702: Erase the selected memory block during an erasing stage;
Step 704: Maintain the bottom select gate SG_B to be turned on during a maintaining period before the top select gate SG_T is turned on during a verification stage.
Step 706: End.

Detailed operations of the erasing and verification process 70 can be derived by referring to the above description, and are not narrated hereinafter for brevity.

In summary, by maintaining the bottom select gate SG_B to be turned on during a maintaining period before the top select gate SG_T is turned on during the verification stage, the present disclosure increases channel discharging time to avoid voltage drop of the word lines due to channel discharging coupling and false error verification.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A memory device, comprising:
a memory string comprising a top select gate, word lines, and a bottom select gate; and
a control circuit coupled to the memory string and configured to, in an erasing operation:
apply an erasing voltage to the memory string;
apply a verifying voltage to at least one word line of the word lines after applying the erasing voltage to the memory string;
apply a first turn-on voltage to the bottom select gate before applying the verifying voltage to the at least one word line; and
apply a second turn-on voltage to the top select gate after stopping application of the erasing voltage for a period of time.

2. The memory device of claim 1, wherein
the memory string further comprises a P-well; and
the control circuit is further configured to apply the erasing voltage to the P-well.

3. The memory device of claim 1, wherein the control circuit is further configured to:
apply the first turn-on voltage to the bottom select gate, maintaining at least until applying the second turn-on voltage to the top select gate.

4. The memory device of claim 1, wherein the control circuit is further configured to:
apply the first turn-on voltage to the bottom select gate, maintaining at least until applying the verifying voltage to the at least one word line.

5. The memory device of claim 1, wherein the control circuit is further configured to:
float the bottom select gate before applying the first turn-on voltage to the bottom select gate; and
apply the first turn-on voltage to the bottom select gate, starting after a floating voltage on the bottom select gate drops.

6. The memory device of claim 5, wherein the control circuit is further configured to:
apply the first turn-on voltage to the bottom select gate, starting when the floating voltage on the bottom select gate drops to the first turn-on voltage.

7. The memory device of claim 5, wherein the control circuit is further configured to:
apply the first turn-on voltage to the bottom select gate, starting after the floating voltage on the bottom select gate drops to a voltage lower than the first turn-on voltage.

8. The memory device of claim 2, wherein the control circuit is further configured to apply the first turn-on voltage to the bottom select gate, starting before a voltage on the P-well drops from the erasing voltage to zero.

9. The memory device of claim 1, wherein the control circuit is further configured to apply a voltage proximity 0V to the at least one word line during applying the erasing voltage to the memory string.

10. The memory device of claim 1, wherein the control circuit is further configured to apply the first turn-on voltage to the bottom select gate, starting when the erasing voltage is applied to the memory string.

11. A method for operating a memory device comprising a memory string, the memory string comprising a top select gate, word lines, and a bottom select gate, the method comprising:
applying an erasing voltage to the memory string;
applying a verifying voltage to at least one word line of the word lines after applying the erasing voltage to the memory string;
applying a first turn-on voltage to the bottom select gate before applying the verifying voltage to the at least one word line; and
applying a second turn-on voltage to the top select gate after stopping application of the erasing voltage for a period of time.

12. The method of claim 11, wherein the memory string further comprises a P-well; and
    applying the erasing voltage to the memory string comprising: applying the erasing voltage to the P-well.

13. The method of claim 11, further comprising:
    applying the first turn-on voltage to the bottom select gate, maintaining at least until applying the second turn-on voltage to the top select gate.

14. The method of claim 11, further comprising:
    applying the first turn-on voltage to the bottom select gate, maintaining at least until applying the verifying voltage to the at least one word line.

15. The method of claim 11, further comprising:
    floating the bottom select gate before applying the first turn-on voltage to the bottom select gate; and
    applying the first turn-on voltage to the bottom select gate, starting after a floating voltage on the bottom select gate drops.

16. The method of claim 15, wherein applying the first turn-on voltage to the bottom select gate, starting when the floating voltage on the bottom select gate drops to the first turn-on voltage.

17. The method of claim 15, wherein applying the first turn-on voltage to the bottom select gate, starting after the floating voltage on the bottom select gate drops to a voltage lower than the first turn-on voltage.

18. The method of claim 12, wherein further comprising applying the first turn-on voltage to the bottom select gate, starting before a voltage on the P-well drops from the erasing voltage to zero.

19. The method of claim 11, further comprising applying the first turn-on voltage to the bottom select gate, starting when the erasing voltage is applied to the memory string.

20. A memory system, comprising:
    a memory device comprising:
        a memory string comprising a top select gate, word lines, and a bottom select gate; and
        a control circuit coupled to the memory string and configured to, in an erasing operation:
            apply an erasing voltage to the memory string;
                apply a verifying voltage to at least one word line of the word lines after applying the erasing voltage to the memory string;
            apply a first turn-on voltage to the bottom select gate before applying the verifying voltage to the at least one word line; and
            apply a second turn-on voltage to the top select gate after stopping application of the erasing voltage for a period of time.

* * * * *